United States Patent [19]

Esser

[11] 4,207,477
[45] Jun. 10, 1980

[54] BULK CHANNEL CCD WITH SWITCHABLE DRAINING OF MINORITY CHARGE CARRIERS

[75] Inventor: Leonard J. M. Esser, Eindhoven, Netherlands

[73] Assignee: U.S. Philips Corporation, New York, N.Y.

[21] Appl. No.: 913,444

[22] Filed: Jun. 7, 1978

Related U.S. Application Data

[63] Continuation of Ser. No. 789,211, Apr. 20, 1977, abandoned, which is a continuation of Ser. No. 616,866, Jun. 25, 1975.

[30] Foreign Application Priority Data

Oct. 8, 1974 [NL] Netherlands ........................ 7413207

[51] Int. Cl.² ........................ G11C 19/28; H01L 29/78
[52] U.S. Cl. ........................ 307/221 D; 357/24
[58] Field of Search ........................ 357/24; 307/221 D

[56] References Cited

U.S. PATENT DOCUMENTS

| | | | |
|---|---|---|---|
| 3,789,267 | 1/1974 | Krambeck et al. | 357/24 |
| 3,896,474 | 7/1975 | Amelio et al. | 357/24 |
| 3,896,485 | 7/1975 | Early | 357/24 |
| 3,913,077 | 10/1975 | Erb | 357/24 |
| 4,012,759 | 3/1977 | Esser | 357/24 |
| 4,028,716 | 6/1977 | Van Santen et al. | 357/24 |
| 4,032,952 | 6/1977 | Ohba et al. | 357/24 |

OTHER PUBLICATIONS

Erb et al., "An Overlapping Electrode Buried Channel CCD," IEEE Int. Electron Devices Meeting, (12/73), Tech. Dig., pp. 24–26.

Primary Examiner—Gene M. Munson
Attorney, Agent, or Firm—Thomas A. Briody; Jack Oisher; Steven R. Biren

[57] ABSTRACT

The invention relates to a charge-coupled device in which the charge transport in the form of majority charge carriers takes place mainly via the bulk of a semiconductor layer of one conductivity type. The semiconductor layer has zones of the second conductivity type which do not have an electric contact but which are electrically biased by means of the isolation zone surrounding the semiconductor layer which can be connected to the zones by induction by means of the electrodes and forms a drain for charge carriers from the zones. In an embodiment the device is formed by a two-phase charge-coupled device in which the zones serve to obtain asymmetry in the system. In another embodiment the device is a series-parallel-series multiplex CCD in which the zones form isolation zones between the parallel lines.

11 Claims, 12 Drawing Figures

BULK CHANNEL CCD WITH SWITCHABLE DRAINING OF MINORITY CHARGE CARRIERS

This is a continuation, of application Ser. No. 789,211, filed Apr. 20, 1977, now abandoned which is a continuation of Ser. No. 616,866, 6/25/75.

The invention relates to a semiconductor device forming a bulk-channel charge-coupled device. Such charge-coupled devices have a semiconductor body comprising a surface-adjoining semiconductor layer of one conductivity type which has a thickness and a doping concentration at which a depletion zone can be obtained throughout the thickness of the layer by means of an electric field while avoiding breakdown, means being present to insulate or isolate the semiconductor layer from the surroundings and means to locally introduce into the semiconductor layer information in the form of charge packets consisting of majority charge carriers, and means to read out said information elsewhere in the semiconductor layer. An electrode system having a number of electrodes insulated from the semiconductor body by an intermediate insulating layer is present at the surface of the semiconductor layer for capacitively generating electric fields in the semiconductor layer by means of which the charge can be transported to the read-out means through the layer in a direction parallel to the layer, the semiconductor body further comprising a number of surface zones of the second conductivity type opposite to the said one conductivity type present below the insulating layer and adjoining the semiconductor layer, said surface zones extending at least partly below the electrodes.

"Majority charge carriers" are to be understood to mean charge carriers of that type of which, in thermal equilibrium and in the absence of external electric fields, the concentration is larger, for example at least 100 times larger, than the concentration of charge carriers of the other type, the so-called minority charge carriers.

A charge-coupled device of the above-described type is distinguished in particular from the more conventional surface channel, charge-coupled devices in which the charge transport takes place mainly along the surface of the semiconductor layer in that during the transport from a charge storage space to a next charge storage space, at least the last fractions of charge to be transferred—which mainly determine the speed of the charge transport—can be transferred in the interior or the bulk of the semiconductor layer.

Semiconductor devices with bulk transport are described inter alia in the already pre-published Dutch Patent Application No. 71.14770 corresponding to copending application Ser. No. 504,372, filed Sept. 9, 1974, now abandoned and replaced by continuation application Ser. No. 866,004, and in copending application Ser. No. 450,996, filed May 14, 1974, (now U.S. Pat. No. 4,110,777) (abandoned and replaced by continuation application Ser. No. 630,538, filed Nov. 10, 1975, now U.S. Pat. No. 4,012,759) Ser. No. 545,408, filed Jan. 30, 1975, and Ser. No. 452,714, filed May 30, 1974 (abandoned and replaced by continuation application Ser. No. 618,928, filed Oct. 2, 1975, now U.S. Pat. No. 4,012,758).

Published Netherlands Patent Application 73.04634, which corresponds to U.S. Pat. No. 4,032,952 furthermore describes a charge-coupled device with bulk transport which can be operated as a two-phase system. For that purpose, a number of barrier-forming surface zones of the second conductivity type are provided below the electrodes by means of which during operation an asymmetric potential pattern can be obtained in the parts of the semiconductor layer present below the relevant electrodes. In this case the surface zones are, at least partly, depleted and as a result represent a quantity of electric charge of the same polarity as the majority charge carriers to be transported in the form of non-neutralized ions.

It may often be desired for a satisfactory operation to provide the surface zones with extra members, for example, an electric connection, for draining charge carriers of the type opposite to the said majority charge carriers. By providing such connections, the wiring at the surface of the semiconductor body, however, may become very complex, in particular since in most of the cases a multilayer wiring is required. The advantages presented in general by a two-phase charge-coupled device are at least partly nullified again by it.

This drawback may also occur in charge-coupled devices other than the two-phase device described here as will become apparent inter alia from the accompanying description of the Figures.

One of the objects of the present invention is therefore to provide a device of the kind mentioned in the preamble in which the surface zones are not provided with such an electric connection i.e. are left floating, and in which satisfactory removal of (generated) charge carriers of the type opposite to the majority charge carriers can nevertheless be obtained in normal operating conditions.

The invention is based inter alia on the recognition that, besides in the form of contacts, electric connections can also be obtained in the form of surface-adjoining inversion layers induced in the semiconductor body and that, in particular in the present case to which the invention relates, such induced layers can be obtained in normal operating conditions by means of the electrodes insulated from the semiconductor layer.

Therefore, a semiconductor device having a charge-coupled device of the kind mentioned in the preamble is characterized according to the invention in that the semiconductor body comprises a further surface region of the second conductivity type which extends parallel to the semiconductor layer in the semiconductor body, adjoins the semiconductor layer and has an electric connection, the electrodes extending to above said further surface region and electric connections in the form of surface-adjoining inversion layers can be induced capacitively between the surface region and the barrier surface zones by means of the voltages to be applied to the electrodes in the operating condition.

Since in a semiconductor device according to the invention the surface zones need not each individually be provided with an electric connection, the wiring to be provided at the surface can be maintained comparatively simple, while nevertheless charge carriers can be drained efficaciously from the surface zones via the said further surface region and via the electric connection connected to said region. The charge carriers of the second type can flow along the surface to the further surface region of the second conductivity type under the influence of the electrodes extending above the surface zones, as in insulated gate field effect transistors in which the said further surface region constitutes the drain zone, the surface zones each constitute a source zone, the electrodes each constitute the insulated gate electrode, and the underlying part of the semiconductor body or the semiconductor layer constitutes the channel region of a transistor.

The drain region can be formed, for example, by an induced inversion region or an additional zone provided in the semiconductor layer. However, a preferred embodiment of the semiconductor device according to the invention is characterized in that the further surface region of the second conductivity type in the direction of charge transport extends in the semiconductor body over at least substantially the whole length of the semiconductor layer along the semiconductor layer and is common with the said means isolating the semiconductor layer.

The surface region belonging to the isolating means may be formed by an island-isolating surface zone, for example, as is usual in integrated circuits in which the semiconductor body is formed by a substrate of the second conductivity type and by an epitaxial layer of the first conductivity type provided thereon and having therein the semiconductor layer in the form of an island which is bounded by the isolation zone. The isolation zone may be provided with a separate connection or be provided with an electric connection via the substrate.

In a further practical embodiment, in which the semiconductor layer is obtained, for example, by redoping a surface part of a semiconductor body of the second conductivity type by means of ion implantation, the surface region belonging to the isolating means may be formed by a nonredoped part of the semiconductor body adjoining the semiconductor layer.

In preferred embodiments of a semiconductor device according to the invention (described thus far) (see FIGS. 1-3 and 9), the barrier surface zones of the second conductivity type serve to provide an asymmetric potential variation in the semiconductor layer below the electrodes so that the device can be operated as a two-phase system.

In other embodiments of a device according to the invention (see FIGS. 4-7) a number of parallel inputs or outputs are provided which are separated from each other by the barrier surface zones. In this case also the surface zones need not be provided with separate electric connections but may be connected to the said isolation zone in the manner already described by means of the voltages to be applied to the electrodes and be set up at a suitable bias voltage via the isolation zone.

The invention will now be described in greater detail with reference to a few embodiments and the associated diagrammatic drawing, in which.

It is to be noted that the drawing is diagrammatic and not drawn to scale for reasons of clarity.

Figure 1:
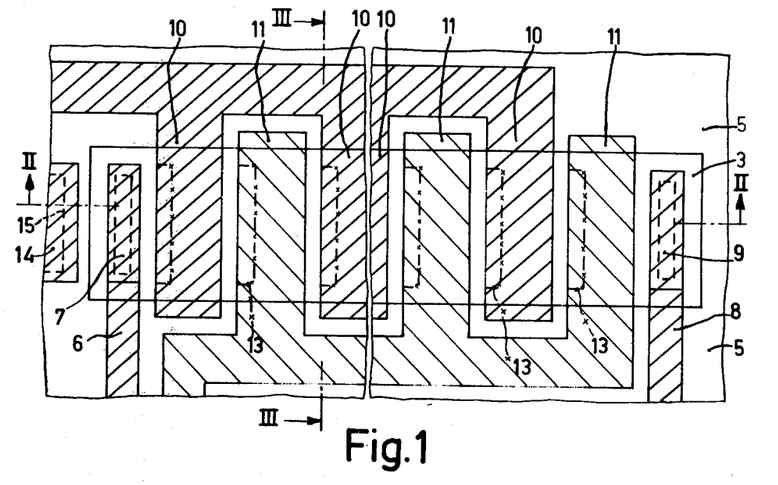
FIG. 1 is a plan view of a charge-coupled device according to the invention.
Figure 2:
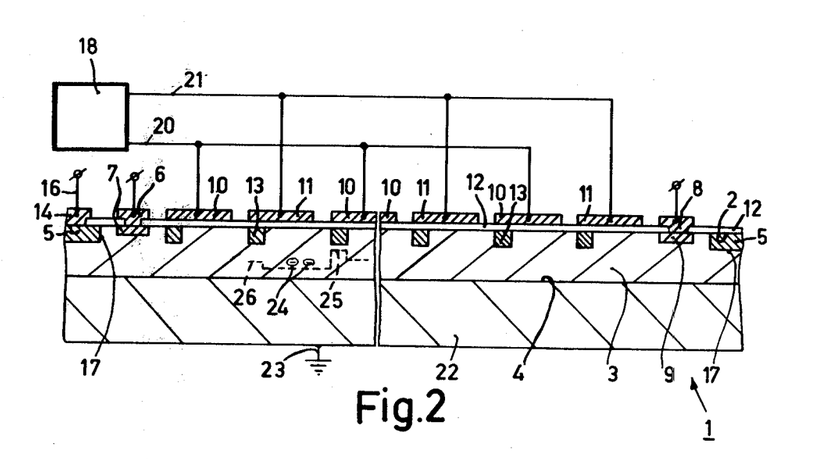
FIG. 2 is a cross-sectional view of the device shown in FIG. 1 taken on the line II—II.
Figure 3:
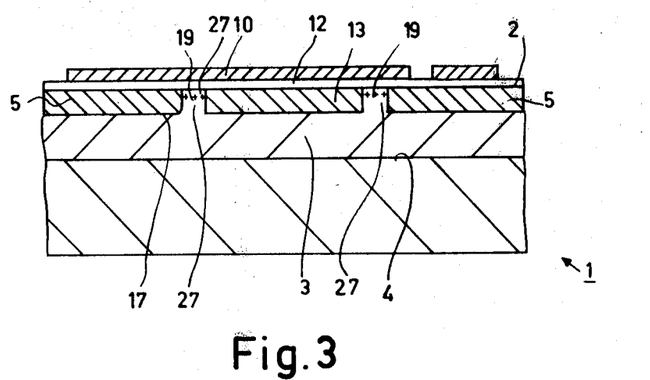
FIG. 3 is a cross-sectional view of the same device taken on the line III—III of FIG. 1.

The semiconductor device shown in FIGS. 1 to 3 comprises a charge-coupled device of the type which is often referred to in literature as bulk-CCD because the charge transport, contrary to more conventional devices, does not take place along the surface but at least mainly in the bulk of the semiconductor body. For that purpose the device comprises a semiconductor body 1 having an n-type semiconductor layer 3 which adjoins the surface 2 and the thickness and the doping concentration of which has been chosen to be so low that a depletion zone can be obtained throughout the thickness of the layer by means of an electric field while avoiding breakdown. In the present embodiment the layer 3 is formed by a silicon layer having a thickness of approximately 5 $\mu$m and a doping concentration of approximately $5.10^{14}$ atoms/ccm. Of course, other suitable semiconductor materials may also be used instead of silicon.

In order to keep the charge carriers to be transported within the semiconductor layer 3, means are present to isolate the layer 3 from its surroundings, at least during operation. Said means include inter alia the p-n junction 4 to be biased in the reverse direction during operation and by means of which the layer 3 can be isolated at the major surface present opposite to the surface 2, and the isolation zones 5 by means of which the layer 3 can be isolated on the sides. By using such an isolated comparatively thin and high-ohmic semiconductor layer 3, the charge transport can take place in the interior of the semiconductor body 1 instead of at the surface 2.

The information-containing charge carriers can be introduced locally into the layer 3 by generation under the influence of absorption of incident radiation. In the present embodiment, however, information in the form of charge packets consisting of electrons can be introduced into the semiconductor layer 3 via the input contact 6 and the highly doped n-type contact zone 7. The size of said packets may form a measure of the value of an electric input signal which can be applied to the input contact 6. The charge can be read out by means of read-out means which are shown diagrammatically only in the figures by the output contact 8 and the contact zone 9.

Present at the surface 2 of the semiconductor layer 3 is an electrode system for generating electric fields in the semiconductor layer 3 by means of which the charge can be transported to the read-out means (8, 9) through the layer in a direction parallel to the layer. The electrode system comprises a number of electrodes which are referenced alternately 10 and 11. An insulating layer 12 of silicon oxide is present between the electrodes 10 and 11 and the surface 2 of the body 1. The layer 12 may also consist of other materials instead of silicon oxide, for example, silicon nitride or aluminum oxide or of combinations of different materials.

It is to be noted that the oxide layer 12 is not shown in the plan view of FIG. 1 for simplicity.

The semiconductor body 1 furthermore comprises a number of p-type barrier surface zones 13 which are present below the insulating oxide layer 12 and which in the present embodiment extend entirely below the electrodes (10, 11) and which are denoted in FIG. 1 by chain lines.

In addition to the p-type zones 13 the body 1 comprises a further p-type surface region which adjoins the layer 3 and which in the embodiment shown is formed by the p-type isolation zones 5 belonging to the said insulating means but which in other embodiments, in which, for example, the isolation zone consists of insulating material, may also be formed by an additional surface zone provided in the semiconductor layer 3.

The p-type surface region or isolation region 5, viewed on the surface 2, extends beside the semiconductor layer 3 in the semiconductor body 1 substantially parallel to the direction of charge transport. The region 5 has an electric connection comprising the connection contact 14 which is contacted to the region 5 via the contact window 15 which is shown in broken lines in FIG. 1. The electric connection furthermore includes, for example, the supply wire 16 shown diagrammatically in FIG. 2.

A suitable voltage can be applied to the isolation zone or the surface region 5 via the electric connection (14, 16), the p-n junction 17 between the insulation zone 5 and the semiconductor layer 3 being biased in the reverse direction.

As is shown in FIGS. 1 and 3, the electrodes 10, 11 extend to above the further surface region or isolation zone 5. As a result of this, the p-type surface zones 13 can be connected, at least temporarily, to the p-type surface region 5 and hence to the voltage source connected to the supply wire 16, via electric connections which can be formed by induction by means of the clock voltages to be applied to the electrodes 10 in the operating condition between the surface zones 13 and the surface region or isolation zone 5. For that purpose, means are present which include inter alia the clock voltage source 18 shown diagrammatically and by means of which clock voltages can be applied to the electrodes 10, 11 in the operating condition so that inversion of the conductivity type can occur at least temporarily at the surface 2 in the n-type parts 19 (FIG. 3) of the semiconductor layer 3 present between the surface zones 13 and the isolation zone 5. Via p-type inversion channels formed in the surface regions 19, holes can be conveyed from the surface zones 13 to the isolation zone 5, as in an insulated gate field effect transistor, the surface zones 13 each constituting a source zone, the electrodes 10, 11 each constituting a gate electrode, and the isolation zone 5 constituting the drain zone of such a transistor.

In the present embodiment the p-type barrier surface zones 13, viewed on the surface 2, extend in the semiconductor body 1 transversely over nearly the full width of the semiconductor layer 3. As is shown moreover in FIGS. 1 and 2, the surface zones 13 are localized asymmetrically relative to the overlying electrodes, in the sense that the zones 13 are present below the edge of the overlying electrodes on the opposite side relative to the adjoining electrodes towards which the charge transport takes place. In the present case in which the charge transport takes place towards the right, the p-type surface zones 13 are therefore present below the left-hand edge of the electrodes (10, 11). As a result of said built-in asymmetry, an asymmetric potential variation can be obtained below the electrodes during operation so that the device can be operated as a two-phase system with only two clock lines which are shown diagrammatically in FIG. 2 by the lines 20 and 21. The electrodes which are connected to the clock line 21 are referenced 11.

The semiconductor layer 3 may consist of a part of a p-type body 1 which has been redoped by means of ion implantation. In a specific embodiment, however, the body 1 comprises a p-type substrate 22 on which an n-type layer has been provided by epitaxial growth, the semiconductor layer 3 being formed by an island-shaped part of the epitaxial layer. The thickness and the doping concentration of the epitaxial layer and hence also of the semiconductor layer 3 are approximately 5 $\mu$m and $5.10^{14}$ atoms/ccm, respectively.

The doping concentration of the substrate 22 is approximately $10^{15}$ acceptors per ccm. The thickness of the substrate is not critical and may at least be chosen to be so large as is desired, for example, with a view to the mechanical rigidity of the device.

The semiconductor layer 3 is surrounded in the epitaxial layer in the manner of an island by the isolation zone 5 which is provided in the epitaxial layer by diffusion of a suitable acceptor impurity or by means of ion implantation. The isolation zone 5 which, if desired, may also extend in the epitaxial layer down to the substrate 22 and need in this case not be provided with a separate contact, in the present embodiment extends in the epitaxial layer only down to a depth of approximately 2 $\mu$m from the surface 2. The island isolation below the zone 5 may be completed by means of an electric field by applying, via the connection (14, 16), a sufficiently large voltage in the reverse direction across the p-n junction 17 so that the part of the epitaxial layer present between the zone 5 and the substrate 22 is completely depleted. The voltages to be applied to the zone 5 and to the substrate 22 in this embodiment may furthermore be varied within comparatively wide limits with respect to each other and be chosen to be so as is desired with a view to a favorable operation of the device.

It is to be noted that semiconductor devices of the kind described above having island-insulating isolation zones in the form of surface zones which extend only over a part of the thickness of the epitaxial layer present particular advantages as compared with devices having more conventional isolation zones which extend from the surface down to in the substrate and may be biased via the substrate. Since the isolation zones in the above described embodiments are not electrically connected to the substrate, other voltages can be applied to the isolation zones than to the substrate, which is often desired for the operation of the device, while nevertheless no extra contacts need be provided at the isolation zones.

The p- type surface zones 13 also extend in the epitaxial layer down to a depth of approximately 1 $\mu$m from the surface 2 and may be obtained, for example, by means of ion implantation or diffusion in the same manner as the isolation zone 5. The doping concentration of the surface zones 13 is, for example, approximately $5.10^{16}$ atoms per ccm.

Figure 2A:
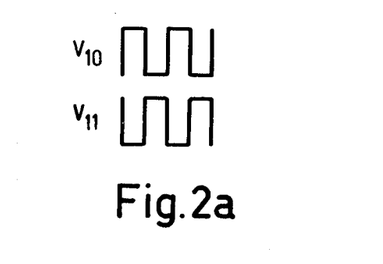
FIG. 2a shows the clock voltages to be applied to the device.

During operation the substrate 22 is set up at a reference potential, for example ground, via the electric connection 23, while a voltage of approximately 20 volts is applied to the semiconductor layer 3 via, for example, the output contact 8; with these voltages, when the electrodes 10, 11 are also set up at ground potential, at least substantially the whole semiconductor layer 3 may be depleted in which substantially no further mobile charge carriers are present in the semiconductor layer 3, except for electrons belonging to the information-forming charge packets. The information in the form of electrons may be applied to the device via the input contact (6, 7). The charge packets may be transported through the layer 3 to the output 8 by applying to the electrodes 10, 11 the clock voltages $V_{10}$ and $V_{11}$, respectively, shown in FIG. 2a. The clock voltage $V_{10}$ which is applied to the electrodes 10 and the clock voltage $V_{11}$ which is applied to the electrodes 11 show opposite phases as is shown in FIG. 2a. The positive stroke of each clock voltage is approximately 10 volts and the negative stroke is approximately 0 volt. During the positive stroke, charge storage regions consisting of potential wells in which electrons 24 can be stored are formed below the electrodes. Such a potential well 25 is denoted diagrammatically in FIG. 2 by broken lines.

The potential wells 25 are bounded by a potential barrier 26 on the left-hand side–so on the opposite side relative to the direction of charge transport. Said potential barriers 26 which can be obtained by means of nonneutralized electric charge in the form of negative ions in the p-type surface zones 13 prevent the electrons 25 from flowing to the left and hence confer upon the system unidirectional transport.

During the negative stroke of the clock voltages, the electrons 24 are transported to a subsequent charge storage space below the adjacent electrode 10. With the given voltages and with a thickness of the oxide layer of approximately 1000 Angstrom, inversion of the conductivity type may simultaneously occur in the n-type surface parts 19 (see FIG. 3), a p-type inversion layer being formed between the p-type surface zones 13 and the isolation zone 5, at least in the presence of sufficient holes in the surface parts 19. Such inversion channels are shown diagrammatically in FIG. 3 by the crosses 27 representing holes. Said inversion channels can at least mainly be built up only with holes originating from the p-type surface zones 13. Not counting the beginning when putting the device into operation, the zones 13 may also supply holes during operation as a result of, for example, thermal generation or as a result of generation of charge carriers upon absorption of radiation of sufficient energy.

During the negative stroke of the clock voltages, charge shifts occur in the zones 13 present below the relevant electrodes, accumulation of holes occurring at the surface of said zones, the adjoining n-type parts 19 being depleted. In the presence of sufficient holes in a surface zone 13 the surface potential difference along the surface 2 between said zone 13 and the adjoining surface part 19 may be so large that holes from said zone 13 flow to the surface part 19 and then into the p-type isolation zone 5 via which they can be drained. Said charge transport which has for its result that the potential, in particular the surface potential in the relevant zone 13 decreases, may continue until the said surface potential difference between the zone 13 and the adjoining surface part 19 has reached a minimum value which is determined by the threshold voltage below the electrodes 10, 11.

In this manner, both holes generated during putting the device into operation and the holes generated further during operation can be drained from the p-type surface zones 13 along the surface 2 to the p-type isolation zone 5. Such a drain of generated charge carriers is possible in that, according to the invention, the electrodes 10, 11 overlap the parts 19 of the semiconductor layer 3 present between the surface zones 13 and the isolation zone 5 and in that the clock voltages at the electrodes 10, 11 are chosen to be so that inversion of the conductivity type may occur at least temporarily at the interface between the n-type surface parts 19 and the oxide layer 12. The device therefore comprises as it were a number of internal field effect transistors the gate electrodes of which are formed by the electrodes 10, 11, the source zones are formed by the p-type surface zones 13, the channel regions are formed by the n-type surface parts 19 of the semiconductor layer 3 and in which the p-type isolation zone 5 constitutes a common drain zone for all the transistors.

Figure 9:
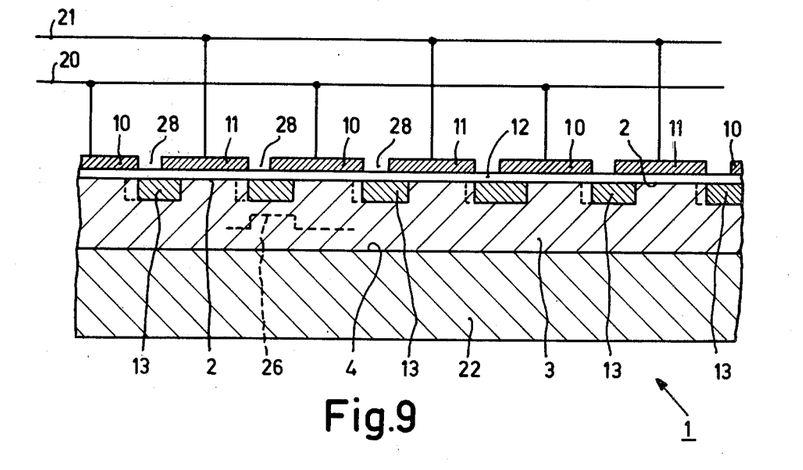
FIG. 9 is a sectional view corresponding to the sectional view shown in FIG. 2 of a part of still a further device according to the invention.

FIG. 9 is a sectional view corresponding to the sectional view shown in FIG. 2 of a second embodiment of a semiconductor device according to the invention. This device is substantially identical to the semiconductor device described with reference to the first embodiment and as regards corresponding components the same reference numerals are used. As contrasted with the preceding embodiment, in the present embodiment the p-type barrier surface zones 13 are not present entirely below the electrodes 10, 11 but, viewed on the surface 2, they project beyond the edge of the overlying electrodes on the opposite side with respect to the adjoining electrodes towards which the charge transport takes place and extend above the parts of the semiconductor layer 3 which are present between the electrodes 10, 11. During operation in which the same vo. ages may be applied as in the preceding embodiment, the potential barriers 26 are formed not only below the electrodes 10, 11 but also in those parts of the semiconductor layer 3 which, viewed on the surface, are present between the electrodes 10, 11. As a result of this it can be prevented that at the area of those parts potential wells are formed as a result of the spaces 28 between the electrodes (interelectrode gaps). The interelectrode gaps 28 cannot be made infinitely small in particular for technological reasons. However, their influence on the operation of the device (transport efficiency) can be considerably reduced by incorporating a quantity of negative charge between the electrodes. In the present case said negative charge is obtained by ionizing the p-type zones 13 at least partially. In the case in which the surface zones 13 extend only to below the interelectrode gaps 28, the removal of holes from the p-zones 13 may take place in the same manner as has been described with reference to the preceding embodiment during the negative stroke of the clock voltages applied to the overlying electrodes. However, in the case in which the zones 13 extend under the whole interelectrode gaps 28 each to below the preceding electrode as is shown in FIG. 9 by broken lines, the transport of holes may just take place during the negative stroke of the clock voltages applied to said preceding electrodes (see FIG. 2a), hence when an inversion layer can each time be induced below the preceding electrodes. The charge transport of holes from the p-type zones 13 can take place in a particularly favorable manner in that at the same time the clock voltages at the other electrodes and hence the potential of the zones 13 which are capacitively coupled strongest with said other electrodes, reach their maximum values.

Another type of semiconductor device according to the invention having a charge-coupled device 42 in which the charge transport takes place at least mainly via the bulk of the semiconductor transport layer 44 will now be described with reference to FIGS. 4-7. In this embodiment of a semiconductor device according to the invention, barrier surface zones 54 adjoining the layer 44 serve to provide a number of parallel inputs and/or outputs. The semiconductor body comprises a number of juxtaposed charge-coupled devices having semiconductor layers 55 which are formed by the said layer-shaped regions of the one conductivity type and have a thickness and a doping concentration at which a depletion zone can be obtained throughout the thickness of the regions by means of an electric field while avoiding breakdown. Means comprising said barrier surface zones 54 of the second conductivity type are present to isolate each of the layer-shaped regions from its surroundings. A further electrode system 60 is present at the surface of the body for capacitively generating electric fields in the layer-shaped regions 55 by means of which the charge packets can be transported through the layer-shaped regions in a direction substantially transverse to the said one direction of charge transport. The juxtaposed charge-coupled devices in a practical embodiment may form, for example, a two-dimensional picture pick-up device or image sensor in which first a two-dimensional picture or radiation pattern is converted into a charge distribution in the layer-shaped regions 55 corresponding to the pattern. Said charge distribution consists, for example, of charge packets which are arranged in a matrix and the size of which forms a measure of the local intensity of the radiation pattern. After picking up the radiation pattern, the formed charge packets of the matrix can be transferred row by row into the said one semiconductor layer 44 and then be further transported. When the semiconductor layer 44 is empty again (depleted) a subsequent row of charge packets of the matrix can be transferred into the semiconductor layer.

Such a two-dimensional picture pick-up device according to the invention may show a particularly simple construction in that the isolation zones 54 of the second conductivity type which define the columns of the matrix need not be provided each individually with an electric connection.

In the present embodiment however, the surface zones 54 of the second conductivity type and the layer-shaped regions 55 present between the surface zones, viewed on the surface, extend from the said one semiconductor layer 44 down to a further layer-shaped region 45 which forms part of a further charge-coupled device 43. The region 45 has a thickness and a doping concentration at which a depletion zone can be obtained throughout the thickness of this region by means of an electric field while avoiding breakdown. Means are present to insulate the further region 45 from its surroundings. A third electrode system 47 is present at the surface of the body for generating electric fields in the further layer-shaped region 45 by means of which charge packets can be transported through the further layer-shaped region in a direction substantially parallel to the said one direction of charge transport. Above each of the juxtaposed layer-shaped regions 55 and beside the further layer-shaped region 45 a further electrode 58 is present which belongs to the means insulating the further region 45 and by means of which depletion zones which extend throughout the thickness of the layer-shaped regions can be formed in the underlying layer-shaped region. In this embodiment the charge packets can be introduced parallel into the matrix and also be removed parallel from the matrix.

Figure 4:
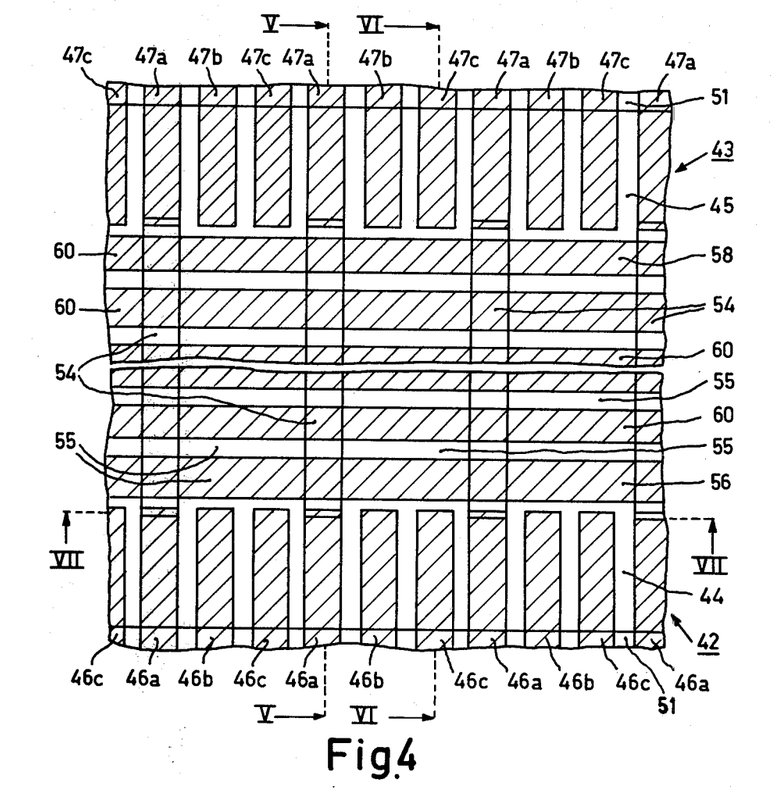
FIG. 4 is a plan view of a further device according to the invention.
Figure 4A:
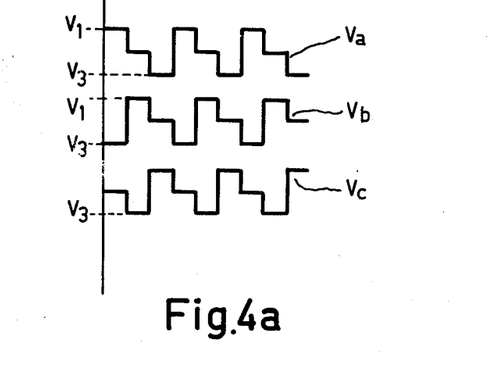
FIG. 4a shows the clock voltages to be applied to the device shown in FIG. 4.
Figure 4B:
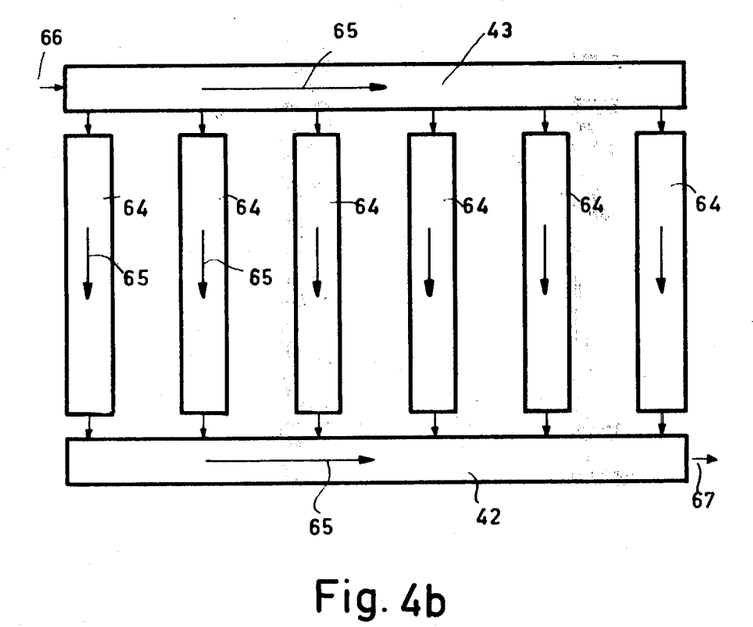
FIG. 4b is a block diagram of the device shown in FIG. 4.

For reasons of clarity, FIG. 4b shows an electric block diagram of the device shown in FIGS. 4-7. The device thus comprises two charge-coupled devices 42 and 43 and a number of intermediately located charge-coupled device 64; the directions of charge transport are denoted by the arrows 65. Electric information, represented diagrammatically by the arrow 66, can be introduced into the shift register 43, for example, at the input of said register. From said register 43, said information may then be introduced parallel into the registers 64. The shift registers 64, the direction of charge transport 65 of which is substantially transverse to the direction of charge transport 65 of the registers 42, 43, serve to introduce the introduced information again into the shift register 42, at the output 67 of which the information may then be read out. By means of such a device, electric input signals can be delayed.

The charge-coupled devices 42 and 43 the directions of charge transport of which are substantially parallel to each other, each comprise a semiconductor layer 44 and 45, respectively, of a suitable configuration as regards, for example, the thickness and the doping concentration. Present above the semiconductor layers 44 and 45 are electrodes 46a, b and c, and 47a, b and c, respectively, to apply electric fields in the semiconductor layers 44, 45 by means of which introduced information in the form of electric charge can be transported through the semiconductor layers. Like the electrodes in the preceding embodiments, the electrodes 46 and 47 are separated from the semiconductor material by an underlying insulating layer 48 of silicon oxide.

The semiconductor layers 44 and 45 are present in an n-type surface layer 50 of the semiconductor body 41 adjoining the surface 49.

Viewed on the surface 49, the n-type semiconductor layers 44, 45 are each separated from adjoining parts of the n-type surface layer on one of the long sides extending parallel to the direction of charge transport by a p-type isolation zone 51. As is shown diagrammatically in FIGS. 5 and 6, said isolation zones comprise an electric connection 52. A voltage in the reverse direction of a sufficient value may be applied across the p-n junctions 53 between the p-type insulation zones 51 and the n-type surface layer 50 by means of a voltage source to be connected to the zones 51 via the connection 52, so that a depletion region to insulate the layers 44, 45 is formed below the zones 51 throughout the thickness of the surface layer 50.

On the long sides of each of the semiconductor layers 44, 45 present opposite to the isolation zones 51, p-type barrier surface zones 54 adjoin the n-type semiconductor layers 44,45. Viewed on the surface 49, the p-type surface zones 54 extend in the n-type surface layer 50 from the semiconductor layers 44, 45 in the direction substantially transverse to the directions of charge transport of the charge-coupled devices 42, 43, as is shown inter alia in the plan view of FIG. 4.

The p-type zones 54 define the intermediate n-type layer-shaped regions 55 which may be isolated from each other by the p-type zones 54 by applying a suitable voltage at the zones 54 as will be described in greater detail hereinafter.

Charge packets consisting of electrons may be introduced into and/or removed from the semiconductor layers 44, 45 of the charge-coupled devices 42, 43 via the n-type intermediate regions 55. Therefore the regions 55 may be considered as a number of parallel inputs and/or outputs of the devices 42, 43 which are separated from each other by the p-type isolation zone 54.

Present above each of the regions 55 is an electrode 56 which, viewed on the surface, is present beside the semiconductor layer 44 and which belongs to the means isolating the layer 44. By means of the electrode 56, depletion zones extending throughout the thickness of the n-type regions may be introduced into the underlying part 57 (see FIG. 6) of the n-type regions to isolate the semiconductor layer 44. The semiconductor layer 45 may be isolated in the same manner by means of the electrode 58 which viewed on the surface 59, is also present above the n-type regions 55 but beside the semiconductor layer 45 and which belongs to the said means isolating the semiconductor layer 45.

In the present embodiment the n-type regions 55 each form part of a number of juxtaposed parallel chargecoupled devices 64 (see FIG. 4b) having semiconductor layers which are formed by the regions 55. For that purpose the regions 55 have a thickness and a doping concentration which are so small that a depletion zone can be obtained throughout the thickness of the regions by means of an electric field while avoiding breakdown. In a specific embodiment the regions 55 may have the same thickness and doping concentration as the semiconductor layers 44, 45.

The regions 55 may furthermore be isolated from the surroundings with the aid of means which also include the p-type barrier surface zones 54 in addition to inter alia the insulating layer 48 present at the surface of the semiconductor body.

It is to be noted that the charge carriers to be transported through the regions 55, as well as in the semiconductor layers 44, 45, can be moved from one storage space to a subsequent storage space at least mainly via the bulk of the regions 55. Present at the surface of the semiconductor body is a further electrode system comprising the electrodes 60 for capacitively generating electric fields in the regions 55 by means of which the charge packets can be transported through the regions 55 in a direction substantially transverse to the direction of charge transport of the devices 42, 43. Said electrode system may furthermore be assumed to include the already mentioned electrodes 56 and 58 belonging to the means isolating the semiconductor layers 44, 45.

The semiconductor body 41 which may be of the same composition as the semiconductor body 1 in the preceding embodiments, comprises a substrate 61 of p-type silicon having a resistivity of, for example, 20–50 ohm.cm and a thickness of approximately 250 μm. The surface layer 50 is formed by an n-type silicon layer which is deposited epitaxially on the substrate 61. The thickness of the epitaxial layer in a specific embodiment is approximately 5 μm and the doping concentration is approximately $10^{14}$ atoms per ccm.

The semiconductor layers 44, 45 of the chargecoupled devices or shift registers 42, 43 are formed by island-shaped parts of the epitaxial layer 50 which are bounded on a long side by the p-type isolation zone 51 and on the other long side by electric fields which can be formed in the epitaxial layer by means of the electrodes 56, 58. The layer-shaped regions 55 are also formed by island-shaped parts of the epitaxial layer 50. The island isolation of each of the regions 55 is formed at least mainly by the p-type surface zones 54 extending from the surface 49 of the body only over a part of the thickness of the epitaxial surface layer 50 in said layer. The isolation may further be completed by applying across the p-n junction 62 between the n-type epitaxial layer 50 and the p-type surface zones 54 such a reverse voltage that a depletion region extending from the p-n junction 62 down to or nearly down to the substrate 61 is formed in the n-type region 63 below the surface zones 54. For that purpose the electrodes 46, 47 of the charge-coupled devices 42, 43 are provided so that the p-type isolation zones 51 on the one hand and the p-type isolation zones 54 on the other hand both extend to below the electrodes 47. The zones 54 may be biased electrically by temporarily connecting electrically the zones 54 during operation to the isolation zone 51 biased in the reverse direction, in a manner analogous to the p-zones 13 in the first embodiment. For that purpose, clock voltages as shown in FIG. 4a may be applied during operation to the electrodes 46, 47 of the devices 42, 43.

The shift registers 42, 43 may be operated as three-phase systems, the clock voltage $V_a$ being applied, for example, to the electrodes 46a and/or 47a, the clock voltage $V_b$ being applied to the electrodes 46b and/or 47b and the clock voltages $V_c$ being applied to the electrodes 46c, 47c.

The clock voltages $V_a$, $V_b$ and $V_c$ are chosen to be so that with the given doping concentrations, oxide thickness and the reverse voltage across the p-n junction between the substrate 61 and the epitaxial layer 50, potential minima for the electrons to be transported occur in the interior of the layers 44, 45, as a result of which the charge transport takes place at least mainly again in the interior of the semiconductor body. The minimum $V_s$ of at least the clock voltage $V_a$ which is applied to the electrodes 46a and/or 47a is chosen to be so that with the given doping concentration in the epitaxial layer 50 and the thickness of the oxide layer 48 inversion of the conductivity type occurs at the voltage $V_3$ at the electrodes 46a, 47a below said electrodes (below which no information-forming charge carriers are then present) or at least may occur—in the presence of minority charge carriers—and holes can be transported from the p-type isolation zones 54 along the surface of the epitaxial layer 50 below the electrodes 46a, 47a to the p-type isolation zone 51 and can be removed via the connection 52.

In this manner, the isolation zones 54, without having extra contacts and connections, may nevertheless be biased electrically upon putting the device into operation and, during operation, may be maintained at a voltage level at which the epitaxial layer below the p-type zones 54 is fully depleted, so that good isolation between the regions 55 of the epitaxial layer 50 is obtained. The amplitude of the clock voltage $V_a$ required for this purpose, and in particular the value of $V_3$, depends on a number of parameters, for example, the thickness of the oxide layer 48, the doping concentration in the epitaxial layer 50, the thicknesses of the epitaxial layer 50 and the p-type zones 54, and the potential of the substrate 61, and can simply be chosen by those skilled in the art in such manner that a satisfactory operation of the device is obtained.

Figure 5:
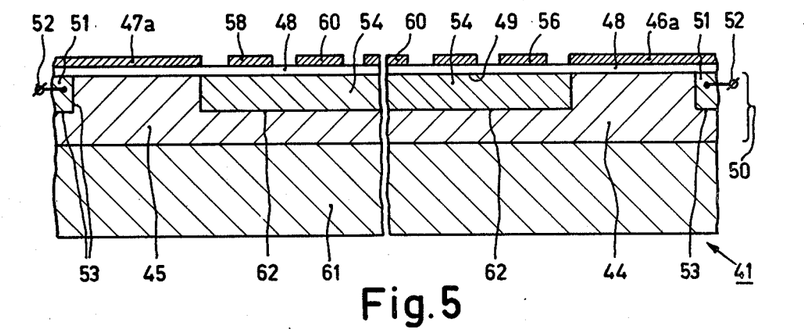
FIG. 5 is a sectional view of the device shown in FIG. 4 taken on the line V—V.
Figure 6:
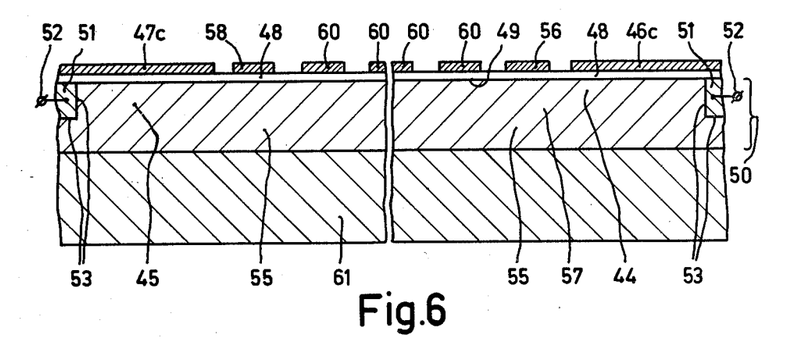
FIG. 6 is a sectional view of the same device taken on the line VI—VI.
Figure 7:
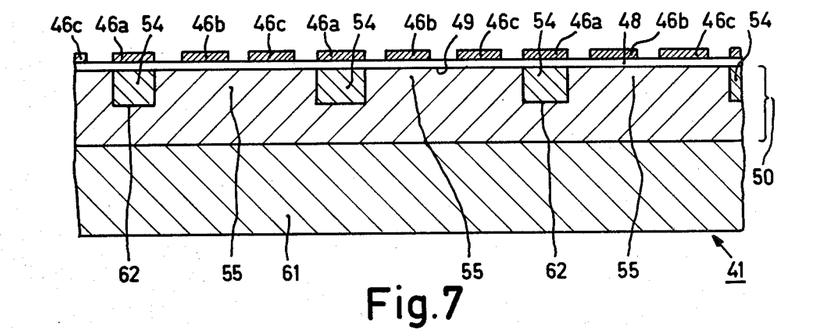
FIG. 7 is a sectional view of the same device taken on the line VII—VII.
Figure 8:
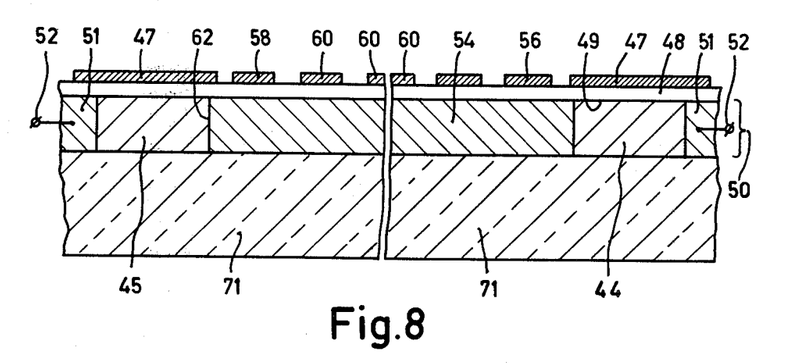
FIG. 8 is a cross-sectional view corresponding to the sectional view shown in FIG. 5 of a further device according to the invention.

FIG. 8 is a cross-sectional view, corresponding to the cross-sectional view of FIG. 5, of a semiconductor device which forms a variation of the device which has been described with reference to the preceding embodiment and differs from this in that instead of a substrate 61 of p-type silicon a supporting body 71 is used of an insulating material. The supporting body 71 may consist, for example, of a spinel or of sapphire; the n-type surface layer may be grown on such a body in the form of an epitaxial layer. It is to be noted that the surface layer 50, as well as further components, bear the same reference numerals as the corresponding components in FIG. 5.

As is shown in FIG. 8, the p-type isolation zones 51 and the zones 54 extend down to the supporting body 71 throughout the thickness of the epitaxial layer 50. The isolation zones 51 may be biased again electrically by means of the electric connections 52 shown diagrammatically only. The p-type isolation zones 54 which do not have such connections may be biased in a manner analogous to the zones 54 in the preceding embodiment in such manner that the p-n junctions 62 between the zones 54 and the n-layer 50 are cut off by field effect action by means of the electrodes, 47. It will be obvious that the isolation zones 51 or 54 can also extend over only a part of the thickness of the layer 50.

It will be obvious that the invention is not restricted to the embodiments described but that many variations are possible to those skilled in the art without departing from the scope of this invention.

For example, the conductivity types of the various regions in the embodiments described may be reversed, in which, of course, the polarities of the applied voltages should also be reversed.

Furthermore, the threshold voltage may advantageously be adjusted at a suitable value at the area of the surface of the semiconductor body along which charge carriers are removed from the surface zones, for example, by choosing the doping concentration at that area to be lower than in adjoining parts of the semiconductor layer.

It is to be noted that the term "read out" should be understood to have a very wide meaning so that not only the actual detection of the charge packets is understood, but other information-processing steps, for example, a temporary storage of the charge packets, are also included.

What is claimed is:

1. A semiconductor charge coupled device having a semiconductor body comprising a surface-adjoining semiconductor layer of one conductivity type which has a thickness and a doping at which a depletion zone can be obtained throughout the thickness of the layer by means of an electric field while avoiding breakdown, means for isolating the semiconductor layer, means for locally introducing into the semiconductor layer information in the form of charge packets containing majority charge carriers, means for reading out said information elsewhere in the semiconductor layer, an electrode system having a plurality of electrodes insulated from the semiconductor body by an intermediate insulating layer present at the surface of the semiconductor layer for capacitively generating electric fields in the semiconductor layer in response to clock voltages applied to the electrodes by means of which the charge can be transported in a direction of charge transport toward the read out means through the layer in a direction parallel to the layer, the semiconductor body furthermore comprising a plurality of barrier surface zones of a second conductivity type opposite to said one conductivity type present below the insulating layer and adjoining the semiconductor layer surface, said barrier surface zones extending at least partly below the electrodes and by means of which said charge packets can be isolated from each other, and switchable means for draining minority carriers from the layer and comprising in the semiconductor body a further surface region of the second conductivity type which extends parallel to the layer in the semiconductor body, adjoins the semiconductor layer, is adjacent but spaced from said barrier surface zones, and has an electrical connection, the insulated electrodes serving as control elements for said switchable means and extending to above said further surface region and the space between the latter and the barrier surface zones, the device construction being such that, when clock voltages are applied in the operating condition to the insulated electrodes, field-induced electric connections can be formed in the body between said further surface region and said barrier surface zones to enable said switchable means and cause minority carriers to be drained from the layer via a flow path, including said switchable means, through said barrier surface zones, the field-induced connections to said further surface region, the further surface region and its electrical connection.

2. A semiconductor device as claimed in claim 1 wherein the said second type barrier surface zones are free of external electrical connections.

3. A semiconductor device as claimed in claim 1, wherein the further surface region of the second conductivity type extends in the direction of charge transport in the semiconductor body over at least substantially the whole length of the semiconductor layer along the semiconductor layer and is common with said means for isolating the semiconductor layer.

4. A semiconductor device as claimed in claim 3, wherein the semiconductor layer comprises first and second oppositely located long sides and is present in a surface layer of one conductivity type which adjoins the surface of the semiconductor body, in which viewed on the surface, the semiconductor layer on said first long side extending parallel to the direction of charge transport is separated from adjoining parts of the surface layer by the further surface region of the second conductivity type having an electrical connection, and in which the barrier surface zones of the second conductivity type are adjacent the second oppositely located long side of the semiconductor layer and adjoin the semiconductor layer and extend in the surface layer from the semiconductor layer in a direction transverse to the direction of charge transport and define a number of intermediate layer-shaped regions of the surface layer which can be isolated from each other by the barrier surface zones and which are common with the means for locally introducing into the semiconductor layer information in the form of charge packets, and in which above each of the intermediate layer-shaped regions an electrode is present parallel to the direction of charge transport which is a part of the means for isolating the semiconductor layer and by means of which the depletion zone which extends throughout the thickness of the surface layer can be formed in the intermediate layer-shaped regions.

5. A semiconductor device as claimed in claim 4, wherein the semiconductor body further comprises a number of juxtaposed charge-coupled devices having semiconductor layers which are formed by said layer-shaped regions of the one conductivity type and which have a thickness and a doping concentration at which a depletion zone can be obtained throughout the thickness of the regions by means of an electric field while avoiding breakdown, in which means comprising the surface zones of the second conductivity type are present for isolating each of the layer-shaped regions from its surroundings, and in which a further electrode system is present at the surface of the body for capacitively generating electric fields in the layer-shaped regions by means of which the charge packets can be transported through the layer-shaped regions in a direction substantially transverse to the said direction of charge transport.

6. A semiconductor device as claimed in claim 5, wherein the surface zones of the second conductivity type and the layer-shaped regions present between the surface zones, viewed on the surface, extend in the surface layer from said one semiconductor layer down from said surface to a further layer-shaped region of the surface layer which forms part of a further charge-coupled device and has a thickness and a doping concentration at which a depletion zone can be obtained throughout the thickness of the further region by means of an electric field while avoiding breakdown, in which means are present for isolating said further region from its surroundings, and in which a third electrode system is present at the surface of the body for generating electric fields in the further layer-shaped region by means of which the charge packets can be transported through the further layer-shaped region in a direction substantially parallel to said one direction of charge transport, and in which above each of the layer-shaped regions and beside the further layer-shaped region a further electrode is present which belongs to the means for isolating the further region and by means of which depletion zones which extend throughout the thickness of the layer-shaped regions can be formed in the intermediate layer-shaped regions.

7. A semiconductor device as claimed in claim 3, wherein the semiconductor layer is of substantially rectangular shape and is present in a surface layer of one conductivity type adjoining the surface of the semiconductor body and, viewed on the surface, is separated from adjoining parts of the surface layer on a long side extending parallel to the direction of charge transport by the further surface zone of the second conductivity type having an electrical connection and in which the barrier surface zones of the second conductivity type are adjacent the oppositely located long side of the semiconductor layer and adjoin the semiconductor layer and extend in the surface layer from the semiconductor layer in a direction substantially transverse to the direction of charge transport and define a number of intermediate layer-shaped regions of the surface layer which can be insulated electrically from each other by the surface zones and are common with the means for reading out the charge packets introduced into the semiconductor layer, and in which above each of the intermediate layer-shaped regions an electrode which is a part of the means for isolating the semiconductor layer is present parallel to the direction of charge transport by means of which a depletion zone which extends throughout the thickness of said region can be formed in the intermediate layer-shaped regions.

8. A semiconductor device as claimed in claim 1, wherein viewed on the surface, the barrier surface zones extend in the semiconductor body transversely over substantially the whole width of the semiconductor layer and are present below the edge of the overlying electrodes on the opposite side with respect to the adjoining electrodes towards which the charge transport takes place.

9. A semiconductor device as claimed in claim 8, wherein the barrier surface zones project beyond said edge of the overlying electrodes and extend above the parts of the semiconductor layer present below the spaces between the electrodes.

10. A semiconductor device as claimed in claim 1, wherein the semiconductor body comprises a semiconductor substrate of the second conductivity type and a surface-adjoining epitaxial layer of the first conductivity type grown thereon, the semiconductor layer being formed by an island-shaped part of the epitaxial layer and the barrier surface zones of the second conductivity type extending in the epitaxial layer from the surface only over a part of the thickness of the epitaxial layer.

11. A semiconductor device as claimed in claim 1, wherein means are present by means of which in the operating condition clock voltages can be applied to the electrodes so that inversion of the conductivity type can occur at least temporarily at the surface in the parts of the semiconductor layer of the first conductivity type present between the surface zones of the second conductivity type and the further surface region of the second conductivity type.

* * * * *

UNITED STATES PATENT OFFICE
CERTIFICATE OF CORRECTION

Patent No. 4,207,477            Dated June 10, 1980

Inventor(s) LEONARD JAN MARIA ESSER

It is certified that error appears in the above-identified patent and that said Letters Patent are hereby corrected as shown below:

Col. 16, line 27, after "semiconductor" delete "comma"

Signed and Sealed this

Seventh Day of October 1980

[SEAL]

Attest:

SIDNEY A. DIAMOND

Attesting Officer      Commissioner of Patents and Trademarks